PHASE LOCKED OSCILLATOR

Original Filed Jan. 29, 1960

INVENTOR.
JOHN E. R. HARRISON
BY T. L. Styner
ATTORNEY

United States Patent Office 3,132,310
Patented May 5, 1964

3,132,310
PHASE LOCKED OSCILLATOR

John E. R. Harrison, Rochester, N.Y., assignor to General Dynamics Corporation, Rochester, N.Y., a corporation of Delaware Continuation of application Ser. No. 5,513, Jan. 29, 1960. This application Aug. 31, 1962, Ser. No. 222,991
11 Claims. (Cl. 331—19)

The present invention relates generally to crystal controlled oscillators and is more particularly concerned with an oscillator selectively operable at a number of predetermined frequencies respectively controlled by different crystals with each frequency being locked to a very stable frequency standard.

This application is a continuation of the copending application Serial No. 5,513, filed January 29, 1960, now abandoned, similarly entitled, and asigned to the assignee of this application.

In a number of different applications, for example, in the frequency control circuits of receiving and transmitting equipment, it is necessary to provide an oscillator which may be operated at any selected one of a number of frequencies. It is, of course, desirable to obtain a very stable output at each frequency while, at the same time, employing only commercially available, relatively inexpensive crystals. The signals developed at the different frequencies should not vary greately in amplitude through the band. Moreover, both the flat amplitude characteristics and the high frequency stability should be obtained without requiring the use of highly complex, expensive circuits.

The principal object of the present invention is, therefore, to provide a new and improved oscillator of the crystal controlled type for developing a plurality of different frequencies each having the stability of a single highly stable frequency standard.

A further object of the invention is to provide an oscillator of the character described which employs only common variety, inexpensive crystals.

Another object of the invention is to provide an oscillator of the character described which employs only simple, inexpensive circuits.

Another object of the invention is to provide an oscillator of the character described having a nearly constant amplitude output throughout its frequency range.

The invention has for a further object the provision of an oscillator utilizing an oscillation sustaining feedback circuit which is effective to provide substantially constant feedback over the entire frequency range without requiring the use of switched capacitors or tuned circuits.

A further object of the invention is to provide an oscillator of the character described wherein the feedback circuit is constructed and arranged to provide substantially constant output throughout the frequency range without, at the same time, distorting the output.

The invention has for another object the provision of a crystal controlled oscillator circuit whose frequency is stabilized by a control loop which mixes the oscillator output with a spectrum of stable frequencies to develop a control signal for adjusting the oscillator frequency to maintain it at a desired value.

The invention has for another object the provision of an oscillator of the type described in the preceding object wherein the control signal is free from R.F. signal components which might adversely affect the oscillator operation.

The invention has for a further object the provision of an oscillator of the type just described wherein the frequency stability of the circuit is relatively high even in the absence of the control signal so that satisfactory operation can be maintained despite failure of one or more components in the control loop.

It is also an object of the present invention to provide an oscillator of the type described which employs transistors throughout in order to realize all of the well-known advantages of these deivces.

The foregoing and other objects are realized, in accordance with the present invention, by providing an oscillator employing a plurality of crystals for controlling its different operating frequencies. The crystals are switched into the oscillator circuit one at a time to develop a desired frequency output within the range. The oscillator includes a feedback circuit employing Zener diodes for clipping both above and below predetermined levels so that the amplitude of the feedback signal remains substantially constant throughout the frequency range, thereby providing an oscillator output of substantially constant amplitude. A portion of the oscillator output is fed to a control loop where it is mixed with a spectrum of equally spaced signals developed from a common, highly stable frequency standard. Each output signal from the oscillator lies approximately midway between two of the spectrum signals and, hence, the mixer is effective to develop a pair of intermediate frequency signals, one of which is the difference or beat between the oscillator signal and the spectrum signal immediately therebelow and the other of which is the difference or beat between the oscillator signal and the spectrum signal immediately thereabove. These two intermediate frequency signals are separated, at most, by a very small amount.

The output of the mixer in the control loop is passed through a filter tuned to the desired intermediate frequency and the resulting signal is detected. Any deviation between the two intermediate frequency signals results in the production of a D.C. control signal which is used to vary the tuning of the oscillator in a direction to make the two IF signals equal. When the latter condition is reached the oscillator output is locked to the frequency standard. The control loop includes a combined low pass and band rejection filter for eliminating the intermediate frequency components and the higher RF components so that the control signal applied to the oscillator does not result in the production of frequency modulated sidebands of the oscillator output signal.

The invention, both as to its organization and method of operation, together with further objects and advantages, will best be understood by reference to the following detailed description taken in conjunction with the accompanying drawing wherein.

Figures 1, 2:
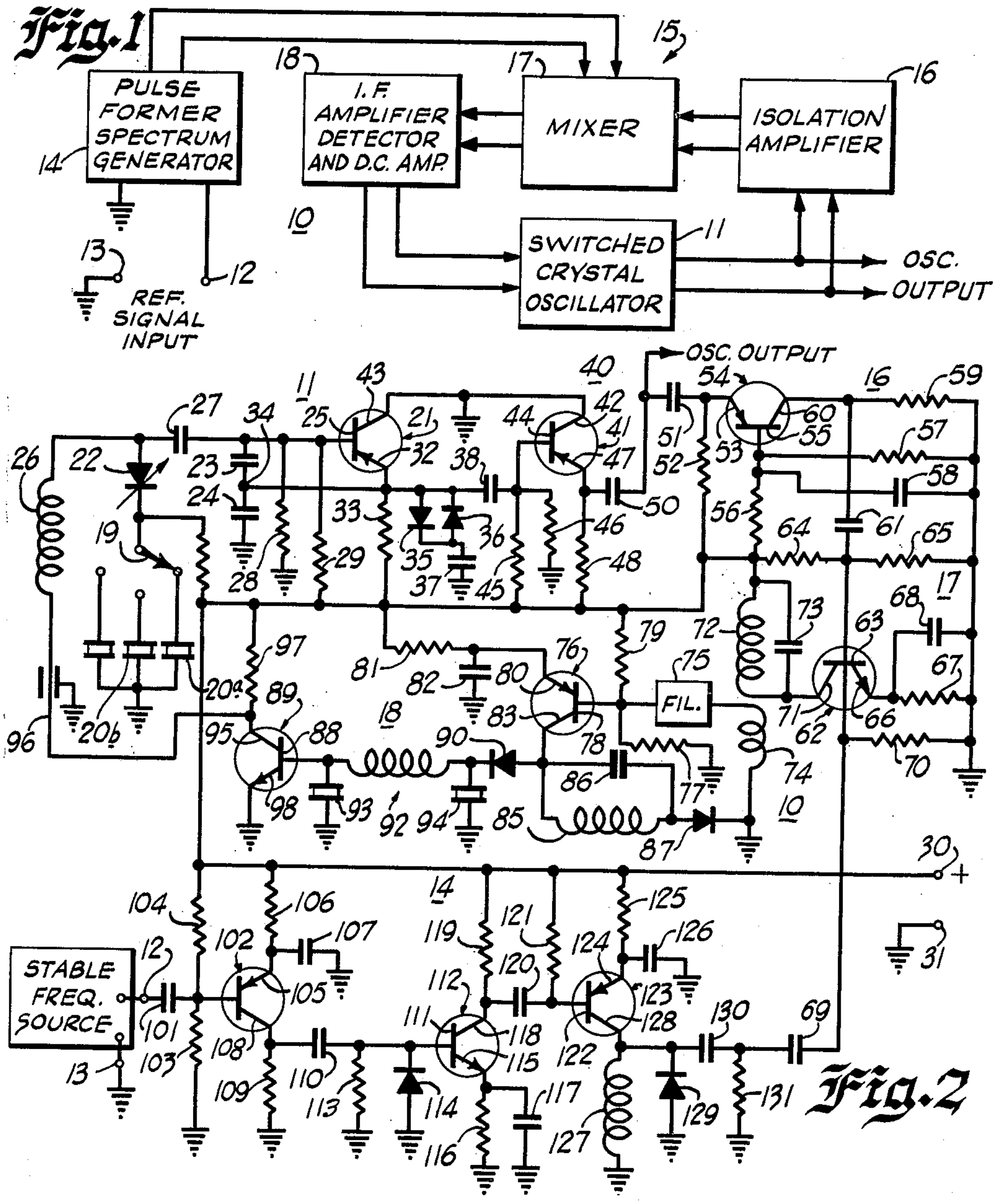
FIG. 1 is a block diagram illustrating an oscillator characterized by the features of the present invention.
FIG. 2 is a schematic diagram showing in some detail the circuit components contained within the blocks shown in FIG. 1.

Referring now to the drawing and first to FIG. 1, the oscillator of the present invention is there identified generally by the reference number 10 and includes a crystal controlled oscillator 11 which is adapted to be operated at any one of a number of different frequencies falling within a predetermined range. Each of the output frequencies from the oscillator 11 is adapted to be locked to a standard which is effective to supply a reference signal to a pair of input terminals 12 and 13. The input signals supplied to the terminals 12 and 13 are passed through a pulse former and spectrum generator 14 to develop a group or spectrum of output signals with the different signals being equally spaced in the spectrum and being separated by the frequency of the input signal.

For example, in one application of the present invention, it is desired to develop from the oscillator 11 signals separated in one megacycle steps within the range from 2.5 to 23.5 megacycles. For this application, the spectrum generator 14 is constructed and arranged to develop signals separated in one megacycle steps and falling within a range from 2 megacycles to 24 megacycles. Thus, each of the frequency channels of the oscillator 11 lies approximately midway between adjacent signals of the spectrum from the generator 14.

The signals developed by the pulse former and spectrum generator 14 are compared with the output signals from the oscillator 11 in a control loop 15 which is effective to develop a unidirectional signal for controlling the frequency of operation of the oscillator 11. More specifically, a portion of the output of the oscillator 11 is supplied through an isolation amplifier 16 to a mixer 17 in the control loop where the oscillator signal beats with the output of the spectrum generator 14. A specific example will demonstrate the operation of the circuit. Thus, let it be assumed that it is desired to develop a 16.5 megacycle signal from the oscillator 11. Normally, in the absence of a signal from the control loop 15, the oscillator runs a few kilocycles below the desired output signal. For example, the crystal for the channel under consideration may be constructed to sustain oscillations at a frequency of 16.498 megacycles. This signal is combined in the mixer 17 with the 16.000 and 17.000 megacycle signals from the spectrum generator 14 with the result that the mixer develops intermediate frequency signals of 498 and 502 kilocycles. These intermediate frequency signals are passed through an amplifier-detector circuit 18 which is effective to produce the 4 kilocycle difference signal therebetween. The 4 kilocycle difference is detected and passed through a D.C. amplifier to develop a control signal for application to the oscillator circuit 11. The unidirectional signal output from the circuit 18 is so polarized that it adjusts the frequency of the oscillator toward 16.500 megacycles. As the output frequency of the oscillator moves toward zero error, the difference frequency output from the circuit 18 becomes lower in frequency and approaches zero. When the zero point is reached, the two intermediate frequency signals from the mixer 17 are so phased that D.C. voltage supplied to the oscillator 11 is at exactly the correct amount to maintain the oscillator at zero error and, as a consequence, the oscillator output is locked at the desired 16.500 megacycle value with the accuracy of the frequency standard supplying signals to the input terminals 12 and 13.

Referring now to FIG. 2 which shows the construction of the circuits illustrated in block form in FIG. 1, it will be observed that the oscillator 11 is a series tuned Colpitts oscillator which is adapted to be operated at any one of a plurality of channel frequencies. As was indicated previously in a specific form of the present invention, it is desired to develop from the oscillator 11 any one of a group of channels lying one megacycle apart within the range from 2.5 to 23.5 megacycles. The particular channel of operation is established by a selector switch 19 which connects different crystals 20*a*, 20*b*, etc. in the base circuit of the oscillator transistor 21. This transistor is preferably of a type which has a very high cutoff frequency so that it can be used to develop the oscillator output throughout the indicated frequency range. The crystals 20*a*, 20*b*, etc. sustain oscillations at frequencies approximately equal to but slightly below the respective channel frequencies. A variable capacity diode 22 connected in the base circuit of the transistor provides means for pulling the oscillator to correct its frequency. This diode varies in capacity as a function of applied D.C. voltage and, as was indicated previously, the described variation is used to adjust the tuning of the oscillator circuit. As is conventional in Colpitts type oscillators, a capacitive divider comprising fixed capacitors 23 and 24 is connected between the base 25 of the transistor 21 and ground for the purpose of supplying the oscillator feedback. The variable capacity diode 22 and the crystal are connected across a small inductor 26 to form the conventional tank circuit in the input of the oscillator. The RF signals in this tank circuit are coupled to the base 25 through a capacitor 27. Bias for the base 25 is provided by means of a D.C. voltage divider network consisting of resistors 28 and 29 connected between the positive and negative terminals 30 and 31 of a suitable D.C. source. The emitter 32 of the transistor 21 is connected through a resistor 33 to the positive terminal of the source and is also connected to the junction point 34 between the capacitor diodes in the feedback circuit.

Operation of the oscillator through the wide frequency range is obtained without switching tuned circuits or capacitors in the feedback circuit. This is accomplished by means of Zener diodes 35 and 36 connected back-to-back and in series with a capacitor 37. The series circuit is connected between the emitter 32 and the negative terminal 31 of the D.C. power supply. This series circuit shunts the capacitor 24 in the feedback circuit and functions to clip the feedback signal above and below predetermined levels in order to maintain the feedback nearly constant throughout the frequency range. The capacitor 37 prevents the diodes from affecting the D.C. voltage at the emitter 32. The amount of clipping is inversely proportional to frequency. More specifically, at the higher frequencies where the divider network, consisting of capacitors 23 and 24, loads the circuit, the diodes 35 and 36 clip appreciably less than at the lower frequencies. Thus, regardless of the input crystal selected, the output from the oscillator remains substantially constant, and in the frequency range of operation indicated, it has been found that a variation of less than 2 db is encountered between the level of output at the lowest frequency channel and that at the highest channel.

The output from the oscillator circuit 11 is coupled through a capacitor 38 to an isolation amplifier 40 which includes a transistor 41 having its collector 42 connected directly to the collector 43 of the transistor 21 with both collectors being connected to ground or, more generally, to the negative terminal of the power supply. The amplifier 40 serves to isolate output of the oscillator from the low impedance load. Bias for the base 44 of the transistor 41 is provided by a voltage divider network consisting of resistors 45 and 46 connected between the positive and negative terminals 30 and 31. The emitter 47 of the transistor 41 is connected to the positive terminal through a load resistor 48 across which the output from the amplifier 40 is developed.

The output from the isolation amplifier 40 is coupled through a capacitor 50 and may be used for any desired purpose, for example, as a local oscillator signal in a receiver. A portion of this output is passed through a coupling capacitor 51 to the control loop 15. More specifically, the signals from the capacitor 51 are applied to the isolation amplifier 16 which serves to avoid the possibility of entry into the oscillator output circuit of signals from the mixer 17. The signals passed by the capacitor 51 are developed across a resistor 52 connected between the emitter 53 of a transistor 54 and the positive terminal 30. Bias for the base 55 of the transistor 54 is provided by a voltage divider network consisting of resistors 56 and 57 connected in series between the positive and negative terminals 30 and 31. The resistor 57 is bypassed by a capacitor 58.

The output from the amplifier 16 is developed across a load resistor 59 connected between the collector 60 and the negative terminal 31 of the power supply. This output is passed through a coupling capacitor 61 to the mixer 17 which includes a transistor 62. The signals from the isolation amplifier 16 are applied to the base 63 of the latter transistor and the bias for the base circuit is supplied by a voltage divider network consisting of resistors 64 and 65 connected between the positive and negative terminals 30 and 31 of the power supply. The emitter 66 of the transistor 62 is connected to the negative terminal 31 through a resistor 67 which is bypassed by a capacitor 68.

The signals from the oscillator 11 are combined in the mixer 17 with signals from the spectrum generator 14, the latter signals being supplied through a coupling capacitor 69 and being developed across a resistor 70 connected between the base 63 and the negative terminal 31. The signals fed to the mixer are combined in the usual manner to develop the sum and difference components together with the applied frequencies. The collector 71 of the transistor 62 supplies the developed signals to an output tank circuit consisting of an inductor 72 and a capacitor 73 connected in parallel. The latter tank circuit is tuned to the desired intermediate frequency or, more specifically, to 500 kc. in the specific form of the invention described above, so that there appears across the tank circuit the two difference frequency signals resulting from mixing of the oscillator signal with the spectrum signals lying immediately thereabove and therebelow. A portion of the energy in the tank circuit is inductively coupled to a pick-up winding 74 and is passed through a suitable band-pass filter 75 tuned to the desired intermediate frequency. The latter filter may be of any conventional band-pass type which is sufficiently broad to pass signals at the intermediate frequency plus or minus a few kilocycles but is, at the same time, sufficiently selective to reject signals deviating from the intermediate frequency by more than a few kilocycles. Preferably, the filter 75 is of the type formed by a ceramic disc plated on both sides.

The filter 75 passes both of the intermediate frequency signals developed by the mixer 17 to the base circuit of a transistor 76 which is connected as an intermediate frequency amplifier and detector. The input signals to the latter amplifier are developed across a resistor 77 connected between the base 78 and the negative terminal 31. Base bias for the transistor 76 is provided by a voltage divider consisting of a resistor 79 connected in series with the resistor 77 across the positive and negative terminals of the D.C. power supply. The emitter 80 of the transistor 76 is connected to the positive terminal 30 through a resistor 81 with the emitter circuit being bypassed to the negative terminal 31 through a bypass capacitor 82. The collector 83 of the transistor is connected to an output tank circuit formed by an inductor 85 connected in parallel with a condenser 86. This tank circuit is connected to the negative terminal 31 through a diode 87 through which the collector current of the transistor 76 passes in order to develop a fixed bias of very small voltage for the base 88 of a transistor 89 connected to serve as a D.C. amplifier. More specifically, the D.C. voltage developed across the diode 87 is applied to the base 88 through the leakage of a detector diode 90, and this bias voltage is of the proper amount to bring the transistor 89 near the point of forward conduction due to the fact that the latter is a silicon transistor of the NPN type.

Figure 3:
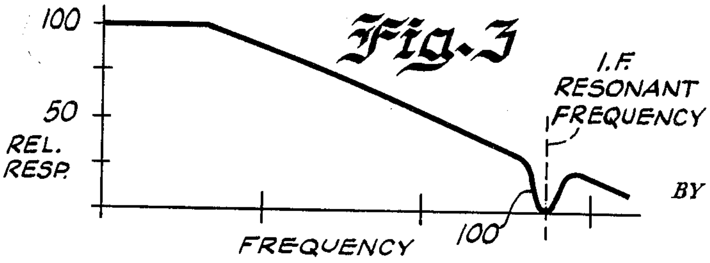
FIG. 3 is a curve which will be useful in explaining the operation of the control loop filter for removing high frequency components.

The transistor 76 develops across the tank circuits 85—86 a low frequency signal corresponding to any frequency difference between the two intermediate frequency signals passed by the filter 75. This low frequency signal is detected by the diode 90 and is applied to the transistor 89 after passing through a low pass rejection notch filter 92 which utilizes a pair of ceramic piezoelectric crystals 93 and 94 preferably of the type formed by a barium titanite disc plated on both sides. By proper design of the crystals a response curve of the type illustrated in FIG. 3 can be obtained wherein the filter exhibits a sharp rejection notch 100 for frequencies near the intermediate frequency, i.e., near 500 kc. in the specific example described above. The filter is also capable of rejecting higher order frequencies so that only the lower frequency components are passed to the base 88 of the transistor 89. The desired characteristics can be obtained by controlling the thickness and velocity of propagation of the ceramic, such as, barium titanite, to establish the resonant frequency and by controlling the area of the plated surface and its thickness and dielectric constant to control the shunt capacity of the crystal. Obviously, the filter 92 is designed to suppress any IF frequency appearing in the output of the amplifier 76 together with the higher frequency signals. The lower frequency variations, that is, the A.C. signal resulting from the difference in frequency between the two IF signals applied to the base of the transistor 76, are detected by the diode and are passed to the transistor 89 which amplifies the resulting unidirectional signals to vary the voltage applied across the variable capacity diode 22. To this end, the amplified unidirectional control signals are developed across a load resistor 97 connected between the collector 95 and the positive terminal 30 and these signals are applied through a shielded lead 96 and through the coil 26 to one side of the capacitor 22. The emitter 98 of the transistor 89 is connected directly to the negative terminal 31.

The IF amplifier 76, the detector 90 and the D.C. amplifier 89 form an integrated circuit which is biased to provide linear detection with complete temperature stability. The circuit provides a D.C. voltage swing of as much as 20 volts which is capable of exercising large control over the variable capacity diode 22 with as little as two millivolts A.C. signal input. The output from this integrated circuit may be as much as 20 kc. without degradation and with the high and intermediate frequencies suppressed over 70 db.

In view of the foregoing description it will be observed that in the specific example previously described, that is, in the case where a 16.5 megacycle output is desired from the oscillator 11, a portion of the oscillator output is combined in the mixer 17 with the spectrum of frequencies supplied from the generator 14. With the oscillator running freely at 16.498 megacycles, and with the spectrum generator 14 containing 16.000 and 17.000 megacycles, the mixer 17 produces two IF signals, i.e., a signal of 502 kc. and one of 498 kc. both of which are passed through the filter 75 and are applied to the IF amplifier 76. These signals combine to produce a 4 kc. signal which is developed across the tank circuit connected to the collector 83. The 4 kc. signal is envelope detected by the diode 90 to produce a unidirectional signal containing the 4 kc. envelope for amplification by the D.C. amplifier including the transistor 89. The latter amplifier supplies the unidirectional voltage containing the envelope to the variable capacity diode 22 of proper polarity to tune the input circuit of the oscillator 11 in a direction to increase the frequency of the oscillator output signal. As the oscillator frequency corrects toward zero error, the envelope signal appearing at the output of the transistor 76 becomes lower in frequency until it eventually reaches zero error. When this point is reached, the two IF signals supplied to the input of the transistor 76 are so phased that the unidirectional voltage supplied to the capacitor 22 is sufficient to maintain the oscillator at zero error with the result that the oscillator is locked to 16.5 megacycles with the accuracy of the frequency standard supplying input signals to the spectrum generator 14.

The spectrum of frequencies delivered to the mixer 17 is developed by supplying highly stable input signals from the terminals 12 and 13 through a coupling capacitor 101 to an amplifier including a transistor 102. In the specific form of the invention described above, the input signal comprises a stable 1 megacycle sine wave. Base bias for the transistor 102 is supplied by a voltage divider consisting of resistors 103 and 104 connected in series between the positive and negative terminals 30 and 31. The emitter 105 of the transistor 102 is connected through a resistor 106 to the positive terminal 30 and this emitter is bypassed to the negative terminal 31 to a bypass capacitor 107. The collector 108 of the transistor 102 is connected to the negative terminal 31 through a load resistor 109 across which the output signals from the amplifier are developed. The signals appearing across the resistor 109 are coupled through a capacitor 110 to the base 111 of a transistor 112. The base 111 is connected to the negative terminal 31 through a resistor 113 across which the input signals are developed. The resistor 113 is connected in parallel with a rectifying diode 114 which clips the sine wave input signals to remove the negative-going portions. The emitter 115 of the transistor 112 is connected to the negative terminal 31 through a load resistor 116 connected in parallel with a bypass capacitor 117. The collector 118 of the transistor 112 is connected to the positive terminal 30 through a load resistor 119 across which the output is developed. The collector circuit of the transistor 112 is easily saturated and, as a consequence, the output appearing across the load resistor 119 is of the pulsed type having relatively fast rise time. This pulse is passed through a differentiator circuit consisting of condenser 120 and resistor 121 in order to form sharp spikes for driving the base 122 of a transistor 123 which functions to generate the desired spectrum. The latter transistor has its emitter 124 connected to the positive terminal 30 through a resistor 125 and the emitter is bypassed to the negative terminal through a bypass capacitor 126. The output from the transistor 123 is developed across a load inductor 127 connected to the collector 128. This inductor is connected in parallel with a diode 129 which functions to eliminate any negative-going wave portions introduced by the pulse former and the differentiator circuit.

In the specific form of the invention described above, the pulsed input to the transistor 123 comprises the one megacycle sine wave input signal together with its harmonics. Thus, the output of the amplifier 123 includes all of the harmonics of the input signal and, as a consequence, this output consists of a spectrum of uniformly spaced (i.e., one megacycle apart) frequencies each having the stability of the input signal applied to the terminals 12 and 13. The inductor 127 serves to flatten the response so that all of the signals falling within the desired spectrum are approximately of the same amplitude thus producing a relatively flat spectrum output. In the embodiment of the invention described above, the inductor was selected to provide a relatively flat spectrum from two megacycles to twenty-four megacycles. The output signal from the amplifier 123 is passed through a second differentiator circuit formed by condenser 130 and resistor 131. In order to further flatten the spectrum, the output from the second differentiator circuit, as was previously indicated, is passed through the coupling capacitor 69 to the mixer 17.

In view of the foregoing discussion, it will be recognized that the circuit described is effective to accomplish the enumerated objects of the present invention. Specifically, this circuit serves to lock any one of a wide range of signals from a crystal controlled oscillator to a highly stable standard, thus permitting the use of relatively inexpensive crystals in the oscillator circuit. Since the oscillator itself is crystal controlled, the maximum error even in unlocked conditions is the tolerance of the crystals being used. Thus, in the event of failure of the control loop or the spectrum generator, the oscillator will be only slightly off frequency and, hence, the receiver or other equipment using the oscillator can be maintained in operation. The circuit described is very simple and, hence, can be constructed relatively inexpensively. Since the circuit uses transistors throughout, it is immune to vibrational or positioning error and, hence, the circuit is well suited for use in portable equipment.

While the present invention has been described in connection with the details of particular embodiments thereof, it should be understood that these details are not intended to be limitative of the invention since many modifications will be readily apparent to those skilled in this art and it is, therefore, contemplated in the accompanying claims to cover any such modifications as fall within the true spirit and scope of the invention.

What is claimed is:

1. A locked oscillator comprising means for providing a stable frequency, means for developing from said stable frequency a spectrum of frequencies made up of the harmonics of the stable frequency, an oscillator including a transistor having a tuning circuit connected to an input electrode, said tuning circuit including a plurality of different crystals and a selector switch for connecting any desired one of said crystals in said tuning circuit so that said oscillator can be made to oscillate at any desired one of a predetermined number of operating frequencies, each of said operating frequencies being intermediate adjacent harmonics of said spectrum, said tuning circuit also including a variable capacity diode whose capacity changes as a function of applied D.C. voltage for altering the operating frequency slightly from that selected by the switch, said oscillator including a feedback circuit connected to feed back to the oscillator input a portion of the oscillator output, said feedback circuit having a pair of back-to-back connected clipping diodes for eliminating from the feedback signal portions falling above and below predetermined levels, thereby to maintain the amplitude of the feedback substantially constant throughout the range of said operating frequencies, a mixer circuit including a transistor having an input electrode excited by said spectrum and by the oscillator output for developing first and second intermediate frequency signals representing the differences between the oscillator output at the operating frequency selected and the harmonics of the spectrum lying immediately above and below the selected operating frequency, a detector including a transistor for obtaining from said first and second intermediate frequency signals a unidirectional signal having a frequency corresponding to any difference therebetween, a rejection notch filter connected to the output of the detector for discriminating against the intermediate frequencies and other higher order components, and a D.C. amplifier including a transistor excited by the low frequency unidirectional signals passed by said filter for supplying said unidirectional signal to said variable capacity diode to alter the oscillator frequency in a direction tending to reduce any such difference, thereby to lock the oscillator for operation with the stability of the stable frequency at a predetermined frequency midway between the harmonics of the spectrum used in developing the first and second intermediate frequency signals.

2. A locked oscillator comprising means for providing a stable frequency, means for developing from said stable frequency a spectrum of frequencies made up of the harmonics of the stable frequency, an oscillator having a tuning circuit therein, said tuning circuit including a plurality of different crystals and a selector switch for connecting any desired one of said crystals in said tuning circuit so that said oscillator can be made to oscillate at any desired one of a predetermined number of uniformly spaced operating frequencies, each of said operating frequencies being within said spectrum, said tuning circuit also including a variable capacity diode whose capacity changes as a function of applied D.C. voltage for altering the operating frequency slightly from that selected by the switch, said oscillator including a feedback circuit connected to feed back to the oscillator input a portion of the oscillator output, said feedback circuit having a pair of back-to-back connected clipping diodes for eliminating from the feedback signal portions falling above and below predetermined levels, thereby to maintain the amplitude of the feedback substantially constant throughout the range of said operating frequencies, a mixer circuit excited by said spectrum and by the oscillator output for developing first and second intermediate frequency signals representing the differences between the oscillator output at the operating frequency selected and harmonics of the spectrum lying uniformly above and below the selected operating frequency, means for obtaining from said first and second intermediate frequency signals a unidirectional signal having a frequency corresponding to any difference therebetween and for supplying said unidirectional signal to said variable capacity diode to alter the oscillator frequency in a direction tending to reduce any such difference, thereby to lock the oscillator for operation with the stability of the stable frequency at a predetermined frequency midway between the harmonics of the spectrum used in developing the first and second intermediate frequency signals.

3. A locked oscillator comprising means for providing a stable frequency, means for developing from said stable frequency a spectrum of frequencies made up of the harmonics of the stable frequency, an oscillator having a tuning circuit therein, said tuning circuit including a plurality of different crystals and a selector switch for connecting any desired one of said crystals in said tuning circuit so that said oscillator can be made to oscillate at any desired one of a predetermined number of operating frequencies, each of said operating frequencies being intermediate adjacent harmonics of said spectrum, said tuning circuit also including a variable capacity diode whose capacity changes as a function of applied D.C. voltage for altering the operating frequency slightly from that selected by the switch, a mixer circuit excited by said spectrum and by the oscillator output for developing first and second intermediate frequency signals representing the differences between the oscillator output at the operating frequency selected and the harmonics of the spectrum lying equally spaced above and below the selected operating frequency, means for obtaining from said first and second intermediate frequency signals a unidirectional signal having a frequency corresponding to any difference therebetween and for supplying said unidirectional signal to said variable capacity diode to alter the oscillator frequency in a direction tending to reduce any such difference, thereby to lock the oscillator for operation with the stability of the stable frequency at a predetermined frequency midway between the harmonics of the spectrum used in developing the first and second intermediate frequency signals.

4. A locked oscillator comprising means for providing a stable frequency, means for developing from said stable frequency a spectrum of frequencies made up of the harmonics of the stable frequency, an oscillator having a tuning circuit therein, said tuning circuit including a plurality of different crystals and a selector switch for connecting any desired one of said crystals in said tuning circuit so that said oscillator can be made to oscillate at any desired one of a predetermined number of operating frequencies, each of said operating frequencies being intermediate harmonics of said spectrum, said tuning circuit also including a variable element for altering the operating frequency slightly from that selected by the switch, a mixer circuit excited by said spectrum and by the oscillator output for developing first and second intermediate frequency signals representing the differences between the oscillator output at the operating frequency selected and the harmonics of the spectrum lying uniformly above and below the selected operating frequency, means for obtaining from said first and second intermediate frequency signals a control signal and for supplying said control signal to said variable element to alter the oscillator frequency in order to lock the oscillator for operation with the stability of the stable frequency at a predetermined frequency midway between the harmonics of the spectrum used in developing the first and second intermediate frequency signals.

5. A locked oscillator comprising means for providing a frequency standard, a spectrum generator coupled to the standard frequency means, an oscillator having a plurality of different tuning circuits therein, a selector switch for connecting any desired one of said tuning circuits in said oscillator so that said oscillator can be made to oscillate at any desired one of a predetermined number of operating frequencies, said tuning circuits also including a variable element for altering the operating frequency slightly from that selected by the switch, means including a mixer circuit excited by said spectrum generator and by the oscillator output for developing a control signal including the mixer products resulting from the combinations of the selected oscillator frequency with two spectrum frequencies uniformly above and below said selected oscillator frequency, and means for directly applying said mixer products to said variable element to alter the oscillator frequency in order to lock the oscillator for operation with the stability of the standard at a predetermined frequency.

6. The apparatus defined by claim 5 wherein the variable element is a variable capacity diode whose capacity changes as a function of applied D.C. voltage and wherein the control signal developed is a unidirectional signal including said mixer products which is effective to instantaneously alter the capacity of the diode in order to control the frequency of the oscillator output.

7. A locked oscillator comprising means for providing a spectrum of harmonically-related signals, an oscillator having a tuning circuit therein for selectively rendering the oscillator effective to develop an output at any one of a number of selected operating frequencies each of which lies midway between selected harmonically-related signals of the spectrum, said tuning circuit including at least one variable element for altering the oscillator tuning slightly from the selected frequency, a mixer jointly responsive to the spectrum and to the output of the oscillator, a band-pass filter means coupled to the output of said mixer, said filter means having a passband adapted to selectively pass only the difference frequencies resulting from the selected operating frequency of said oscillator and said selected frequencies of said spectrum, and a rectifier coupled to the output of said filter for developing a control signal for application to said variable element to alter the tuning of the oscillator.

8. The apparatus defined by claim 7 wherein the oscillator includes a feedback circuit for supplying a portion of the oscillator output to the oscillator input, said feedback circuit including means for maintaining the amount of feedback nearly constant over the range of operating frequencies of the oscillator in order to provide substantially constant oscillator output throughout this range.

9. A phase locked oscillator comprising a stable frequency standard source, a spectrum generator coupled to said standard source and adapted to generate harmonically-related frequencies separated in frequency by the frequency of said standard source, an oscillator having a tuning circuit therein, said tuning circuit including a reactance device having its reactance variable in response to a change in direct current voltage thereacross to alter the oscillator tuning, and a control loop including a mixer stage, said mixer stage being coupled to and jointly responsive to said frequency standard and to the output of said oscillator, band-pass filter means coupled to the output of said mixer and adapted to selectively pass mixer products including the difference frequencies between said oscillator and two harmonically-related frequencies of said spectrum generator, and detector means for detecting the frequency difference between said difference frequencies and for producing a direct current control signal including an envelope of said frequency difference frequencies for application to said device, said control signal being effective to instantaneously alter the reactance of said device in accordance with the instantaneous voltage values of said envelope to vary the tuning of said oscillator to reduce said frequency difference.

10. A locked oscillator comprising means for providing a stable frequency standard, a spectrum generator coupled to said frequency standard and adapted to generate a series of harmonically-related frequencies, an oscillator having a tuning circuit therein, said tuning circuit including an element having reactance which is variable in response to changes in amplitude of direct current voltage thereacross for altering the oscillator tuning, and a control loop including a mixer stage, said mixer stage being jointly responsive to said frequency standard and to the output of said oscillator for generating two intermediate frequencies resulting from the difference in frequency between the operating oscillator frequency and two spectrum frequencies, and means for developing a unidirectional signal envelope coupled to the output of said mixer, said unidirectional envelope having a frequency component which is a function of the magnitude of any deviations of the oscillator output from a predetermined frequency intermediate said two spectrum frequencies and having a polarity which tends to vary the tuning of the oscillator in a direction to reduce any such deviations.

11. A locked oscillator system comprising a source for providing a stable spectrum of harmonically-related signals, an oscillator having a tuning circuit therein for selectively rendering the oscillator effective to develop an output at any one of a number of selected operating frequencies, a mixer, the input circuits of said mixer being coupled to said spectrum source and to said oscillator, said tuning circuit including at least one variable tuning element responsive to changes in amplitude of the D.C. voltage thereacross for altering the oscillator tuning slightly from the selected frequency, said mixer being jointly responsive to said spectrum source and to the output of the oscillator, means connected to said mixer for developing a unidirectional signal for application to said variable element, said unidirectional signal having a frequency component which is a function of the magnitude of deviations of the oscillator output with respect to said stable harmonically-related signals and having a polarity which tends to vary the tuning of the oscillator in a direction to reduce any such deviation, and means for applying said frequency component to said variable tuning element.

References Cited in the file of this patent

UNITED STATES PATENTS

| | | |
|---|---|---|
| 2,685,032 | Cox | July 27, 1954 |
| 2,860,246 | Jakubowics | Nov. 11, 1958 |
| 2,936,428 | Schweitzer | May 10, 1960 |

FOREIGN PATENTS

| | | |
|---|---|---|
| 575,156 | Great Britain | Feb. 6, 1946 |
| 792,418 | Great Britain | Mar. 26, 1958 |